United States Patent
Ngo

[19]

[11] Patent Number: 5,866,958
[45] Date of Patent: Feb. 2, 1999

[54] POWER CONTROL DEVICE FOR REDUNDANT RESET OUTPUTS IN AN ATM SYSTEM AND METHOD OF POWER CONTROL THEREOF

[75] Inventor: Gordon Ngo, Germantown, Md.

[73] Assignee: Samsung Electronics Co., Ltd., Suwon, Rep. of Korea

[21] Appl. No.: 763,108

[22] Filed: Dec. 10, 1996

[51] Int. Cl.$^6$ .............................. H01H 47/00; G06F 13/00

[52] U.S. Cl. .......................... 307/125; 307/139; 395/280; 395/750.01

[58] Field of Search ................................... 395/280, 283, 395/281, 282, 500, 750, 750.01, 750.02, 750.03, 750.04, 750.05, 750.06, 750.07, 750.08; 307/147, 112, 116, 125, 139

[56] References Cited

U.S. PATENT DOCUMENTS

| | | | |
|---|---|---|---|
| 5,530,302 | 6/1996 | Hamre et al. | 307/147 |
| 5,604,873 | 2/1997 | Fite et al. | 395/283 |
| 5,613,130 | 3/1997 | Teng et al. | 395/750.01 |
| 5,664,119 | 9/1997 | Jeffries et al. | 395/283 |

*Primary Examiner*—Jeffrey Gaffin
*Assistant Examiner*—Jonathan S Kaplan
*Attorney, Agent, or Firm*—Jones & Volentine, L.L.P.

[57] ABSTRACT

A power control device includes a power control circuit connected to a power supply and a supervisory power monitor unit for outputting a control pulse to the power control circuit for approximately one second. The power control circuit switches the power supplied at the power control circuit input to an output of the power control circuit when the control pulse is deasserted. A reset output logic device receives the power supplied from the output of the power control circuit when the control pulse is deasserted and outputs the power to reset outputs in a distributed power system.

12 Claims, 3 Drawing Sheets

POWER CONTROL DEVICE FOR REDUNDANT RESET OUTPUTS IN AN ATM SYSTEM AND METHOD OF POWER CONTROL THEREOF

BACKGROUND OF THE INVENTION

1. Field of the Invention

The present invention generally relates to a power control system for an Asynchronous Transfer Mode (ATM) system, and more particularly, to a time delayed control circuit with a power monitor to allow for hot insertion/hot swapping of a power module in an ATM system.

2. Description of the Related Art

In communication systems having distributed power architectures, such as, for example, Asynchronous Transfer Mode (ATM) systems, hot insertion/hot swapping of the power module is a requirement. That is, to perform maintenance, diagnostics, or testing, operators and technicians must be able to insert or remove the power module while the system is operating.

This hot insertion/hot swapping requirement, however, presents a problem for the RESET lines in an ATM system. The RESET lines connect redundancy masters (e.g., a power unit such as a System Power Unit (SPU)) with slave modules (e.g., System Interface Units (SIU)). Generally, either a specialized power supply design or the addition of special power isolation switches have been used in order to satisfy the hot insertion/hot swapping requirement.

Such methods have certain drawbacks. One is that a specialized power supply sequence requires additional relays, which increases the manufacturing and testing costs, complicates the design, and reduces product reliability. Moreover, additional switching controls are needed if special power isolation devices are used.

In light of the foregoing, there exists a need for a power control circuit that satisfies the hot insertion/hot swapping requirement of a distributed power system, and that is simpler, more reliable, and cost effective.

SUMMARY OF THE INVENTION

The present invention is directed to a power control circuit which substantially overcomes one or more of the problems due to the limitations and disadvantages of the related art.

In general, the circuit of the present invention employs a time delayed power control circuit along with a power monitor. By identifying the circuits impacted, a time delay control circuit and a power monitor device can be used to control the voltage. This controlled voltage in turn powers the devices which output the RESET lines to the rest of an ATM system. With this configuration, there are no disturbances on the RESET lines during the insertion/removal of either a SPU front board or the SPU rear board (power supply). The power monitoring device may be provided as part of the function of the supervisory microprocessor chip. In such a case, the only device added is a small power control device.

To achieve these and other advantages and in accordance with the purpose of the invention, as embodied and broadly described, the invention provides for a power control device in a distributed power architecture, comprising a power control circuit, a reset output logic device, an output enable control logic device and a supervisory power monitor. The power control circuit receives power from a power supply and selectively outputs the power. The reset output logic device receives the power from the power control circuit and supplies reset outputs. The output enable control logic device provides an output enable control signal to the reset output logic device. The supervisory power monitor outputs a control pulse to control the power control circuit and the output enable logic device.

In another aspect, the present invention provides for a method of power control in a distributed power architecture. According to this method, power is supplied during a power-up sequence to respective inputs of a power supervisory monitoring device and a power control circuit. The supervisory power monitoring device asserts a control pulse to the power control circuit. An output enable control signal is asserted to an input of a reset output logic device. The output enable control signal is deasserted when the power stabilizes. The control pulse is then deasserted, and the power control circuit switches the power supplied at its input to an output. The power from the power control circuit is then supplied to the reset output logic device.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is directed to a power control circuit incorporating a timed delayed control circuit with a power monitor to allow for hot insertion/hot swapping of a power module in an ATM system.

Figure 1:
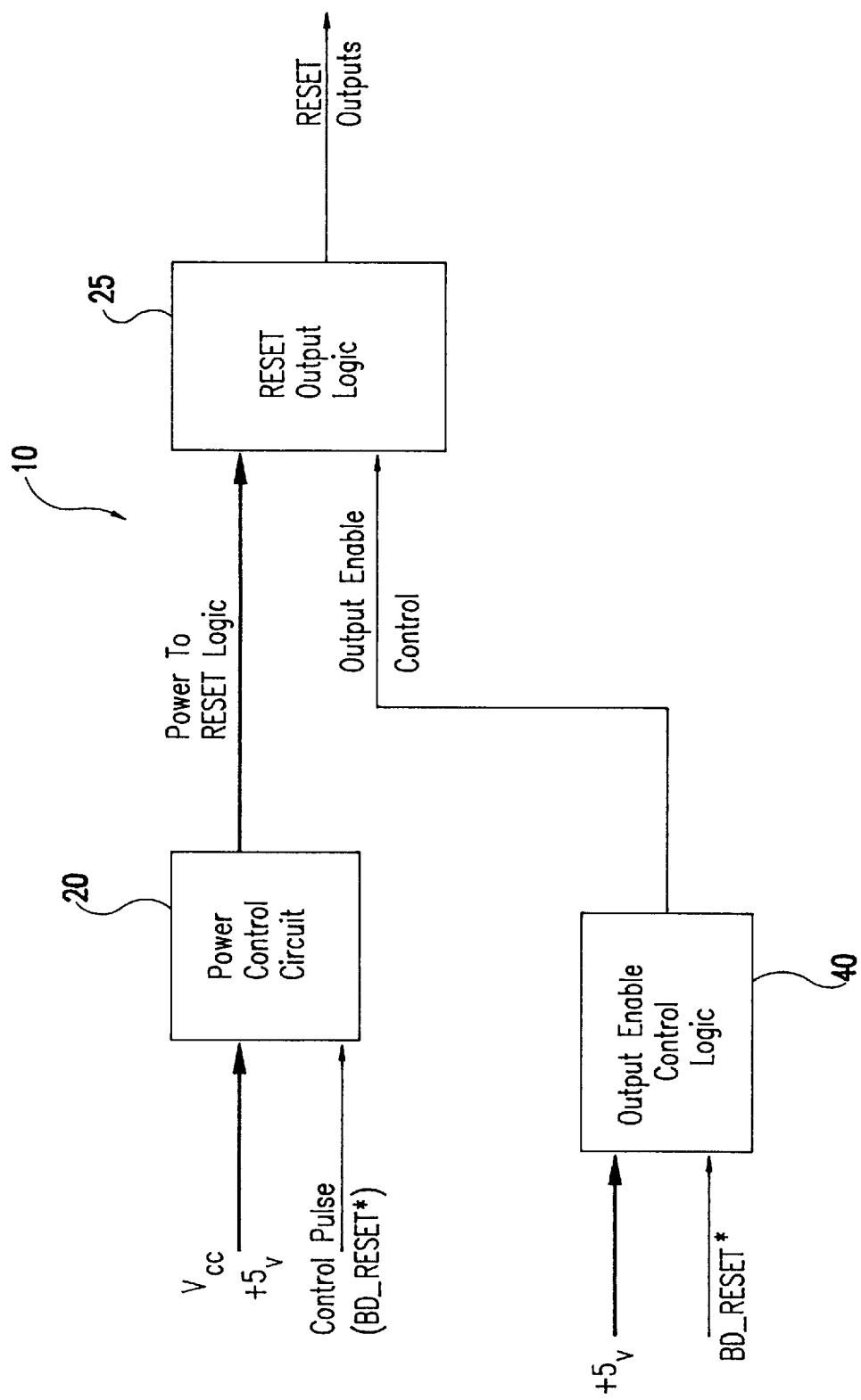
FIG. 1 is block diagram of the power control circuit of the present invention.
Figure 2:
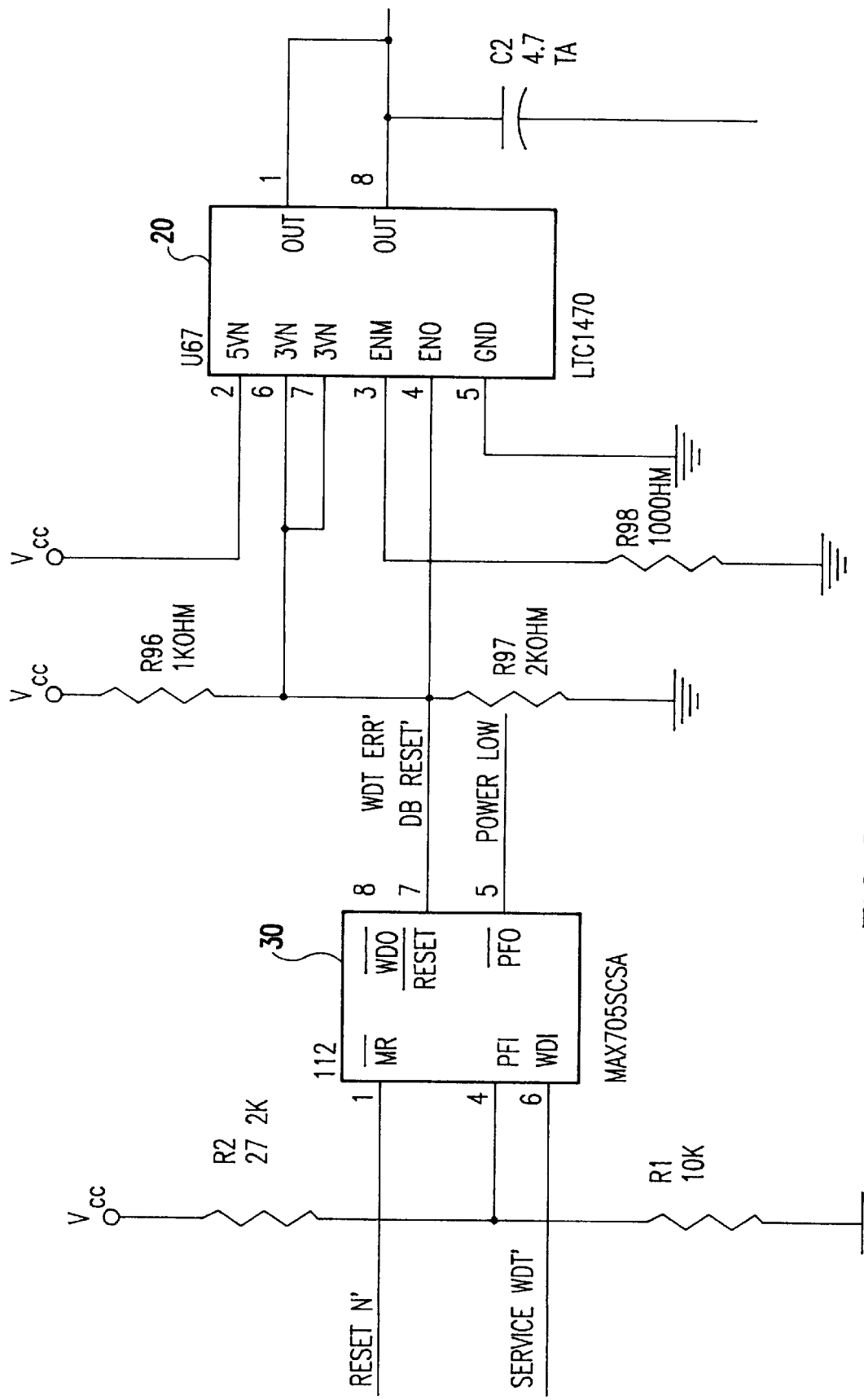
FIG. 2 is a detailed schematic diagram of the power control circuit of the present invention.

Reference will be made to FIGS. 1 and 2, which illustrate respectively a circuit block diagram and a schematic diagram of the circuit 10 of the present invention. The main components of the circuit are power control circuit 20, RESET output logic 25, microprocessor supervisory power monitor 30, and output enable control logic 40.

Generally, the circuit 10 uses the supervisory power monitor 30 board reset (BD_RESET*) output signal to control the power control circuit 20. As shown in the timing diagram in FIG. 3, during any power-up sequence, a control pulse (e.g., board reset) will be asserted to control the power control circuit 20. This in turn shuts off the power to the RESET output logic device 25, forcing the RESET outputs to be in a high impedance mode. The normal +5 V power will have reached steady state prior to the time the board reset control pulse is deasserted. The Output Enable Control signal from output enable control logic block 40 will be deasserted after the normal +5 V power reaches steady state but before the board reset control pulse is deasserted. When the RESET output logic is in the output disabled mode, the controlling power to the RESET output logic will then be turned ON after the control pulse is deasserted.

The reverse sequence occurs during power shut-down. The control pulse will be asserted and the power to the RESET output logic will be turned OFF as soon as the normal power (+5 V) drops below about +4.65 V to +4.75 V.

Note that the outputs of the RESET output logic 25 are in high impedance mode when power is not applied to the RESET output logic device 25. Also, the outputs of the RESET output logic 25 are in high impedance mode when the Output Enable Control signal is deasserted.

The actual implementation of the design only requires an 8-pin device with less than 0.2 square inches of board area plus several passive components. This arrangement is capable of supplying over 1.5 amp of current at +5 V nominal voltage.

The circuit will now be described in greater detail with reference to FIG. 2, which is a schematic diagram of the power control circuit, and FIG. 3, which depicts the relative timing of the circuit during power-up and power-down sequences.

As +5 V (VCC) power is applied to the system, the microprocessor supervisory power monitor 30 asserts the BD_RESET* signal on pin 7 for about one second. This is shown as point A in FIG. 3. The power control circuit 20 output pins 1 and pin 8 are disabled (Open Circuit) while the BD_RESET* signal is asserted.

The BD_RESET* signal is also asserted at the input of the output enable control logic 40, whereby the Output Enable Control signal is asserted at the input to the RESET output logic device 25. After the +5 V power reaches steady state, the Output Enable Control signal is deasserted (see point B in FIG. 3). The Output Enable Control signal will remain deasserted for additional control after board diagnostics are completed.

The same +5 V (VCC) which powered the supervisory power monitor is also applied to pin 2 of the power control circuit 20. The VCC is stabilized (reaches +5 V) sometime during the one second time period that the BD_RESET* signal is asserted. After the one second duration, the supervisory power monitor 30 will deassert the BD_RESET* signal (see point C in FIG. 3) that was sent to the power control circuit 20. At this time, the power control circuit 20 will switch the VCC voltage appearing on input pin 2 to the output pins 1 and 8. Power will then be applied to the RESET output logic 25 shown in FIG. 1 (see also point D in FIG. 3). Recall that the output of the RESET output logic 25 will be in high impedance mode because, as part of the power-up sequence, the Output Enable Control signal was deasserted by the BD_RESET* from the supervisory power monitor 30. This circuit thus allows the RESET lines to maintain normal operation even as the board is powered on.

Figure 3:
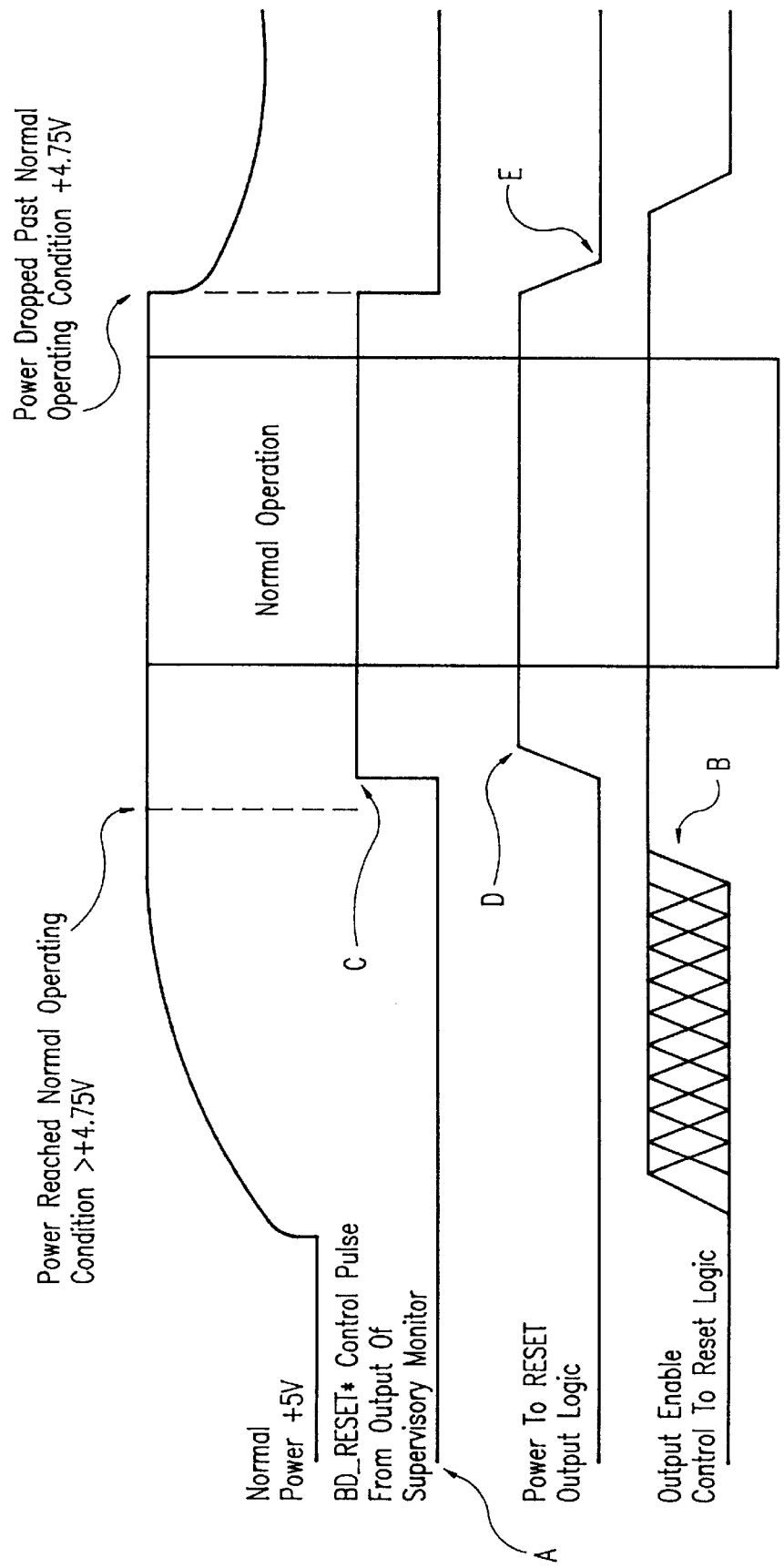
FIG. 3 is a timing diagram of the power control circuit of the present invention.

Summarizing, as shown in FIG. 3, during the power-up sequence, the BD_RESET* control pulse from the supervisory power monitor 30 will be asserted (point A; logic low), thereby shutting off the power to the RESET output logic 25. When the BD_RESET* control pulse is deasserted (point C; logic high) as the +5 V reaches steady state, the power to the RESET output logic 25 is turned ON (point D). The power to the RESET output logic 25 will be turned OFF (point E) when the normal power supply drops below a value of about +4.65 V to +4.75 V.

This design offers several advantages. First, it allows the SPU rear board (power supply) to be hot swappable without having to implement a special design. Second, the design comprises all solid state components without a precision timing circuit. Third, it requires only a small cost and small board area to implement the functions. This design can also be modified to isolate the leakage path on normal integrated circuits provided the electrostatic discharge is handled accordingly.

While the invention has been described in terms of the embodiments described above, those skilled in the art will recognize that the invention can be practiced with modification within the spirit and scope of the appended claims and their equivalents.

Having thus described my invention, what I claim as new and desire to secure by Letters Patent is as follows:

1. In a power supply system having a distributed power architecture, a power control device, comprising:
   a power control circuit having an input for receiving power from the power supply and an output for selectively outputting said power;
   a reset output logic device for receiving said power supplied from the output of the power control circuit and for supplying said power to reset outputs;
   an output enable control logic device for outputting an output enable control signal to the reset output logic device; and
   a supervisory power monitor for outputting a control pulse to control the power control circuit and the output enable control logic device.

2. The power supply system as in claim 1, wherein during a power-up sequence for the power supply, said control pulse is asserted at said input of the power control circuit, thereby disabling outputs of said power control circuit and turning off power to said reset output logic device.

3. The power supply system as in claim 2, wherein during said power-up sequence, said output enable control signal is asserted and supplied to an input of said reset output logic device in response to said control pulse being asserted.

4. The power supply system as in claim 3, wherein after said output enable control signal is deasserted by the output enable control logic device, and after said control pulse is deasserted by the supervisory power monitor, power is supplied to said reset output logic device.

5. The power supply system as in claim 4, wherein said control pulse is deasserted about one second after the power-up sequence commences while said power supply stabilizes.

6. The power supply system as in claim 5, wherein said power supply stabilizes at a voltage level greater than about +4.75 volts.

7. A method of power control in a distributed power architecture system, the method comprising the steps of:
   (a) supplying power during a power-up sequence to respective inputs of a power supervisory monitoring device and a power control circuit;
   (b) asserting, by the supervisory power monitoring device, a control pulse to the power control circuit;
   (c) asserting an output enable control signal to an input of a reset output logic device;
   (d) deasserting the output enable control signal when the power stabilizes;
   (e) deasserting the control pulse;
   (f) switching the power supplied at the input to the power control circuit to an output of the power control circuit when the control pulse is deasserted; and
   (g) supplying the power from the power control circuit to the reset output logic device.

8. The method as in claim 7, wherein during steps (b) and (c), power to the reset output logic device is off.

9. The method as in claim 8, wherein during step (d) the power stabilizes at a voltage level greater than about +4.75 volts.

10. The method as in claim 9, wherein the control pulse in step (e) is deasserted about one second after the power-up sequence commences.

11. The method as in claim 10, further comprising the steps of:
   (h) deasserting said control pulse; and
   (i) turning off power to said reset output logic device.

12. The method as in claim 11, wherein steps (h) and (i) occur when said power has a voltage level which drops below about +4.75 volts.

* * * * *